US006867647B2

(12) United States Patent
Wouters (10) Patent No.: US 6,867,647 B2
(45) Date of Patent: Mar. 15, 2005

(54) OPERATIONAL AMPLIFIER ARRANGEMENT INCLUDING A QUIESCENT CURRENT CONTROL CIRCUIT

(75) Inventor: Patrick August Maria Wouters, Hamme-Merchtem (BE)

(73) Assignee: Alcatel, Paris (FR)

( * ) Notice: Subject to any disclaimer, the term of this patent is extended or adjusted under 35 U.S.C. 154(b) by 276 days.

(21) Appl. No.: 10/137,421

(22) Filed: May 3, 2002

(65) Prior Publication Data

US 2002/0171478 A1 Nov. 21, 2002

(30) Foreign Application Priority Data

May 18, 2001 (EP) .............................................. 01401313

(51) Int. Cl.[7] .................................................. H03F 3/45
(52) U.S. Cl. .......................................... 330/69; 330/258
(58) Field of Search .............................. 330/9, 69, 252, 330/255, 258, 259, 261

(56) References Cited

U.S. PATENT DOCUMENTS

| 4,251,803 A | 2/1981 | Debord et al. |
| 4,358,739 A | 11/1982 | Nelson |
| 4,439,743 A | 3/1984 | Schwarz et al. |
| 4,502,020 A | 2/1985 | Nelson et al. |
| 4,752,745 A | 6/1988 | Pass |
| 5,789,974 A | 8/1998 | Ferguson, Jr. et al. |
| 6,064,262 A | 5/2000 | Wang .......................... 330/253 |
| 6,388,521 B1 | 5/2002 | Henry ......................... 330/258 |
| 2002/0118064 A1 | 8/2002 | Gray .......................... 330/253 |
| 2002/0171479 A1 | 11/2002 | Wouters |

OTHER PUBLICATIONS

Casier H et al. "A 3.3–V, Low–Distortion ISDN Line Driver with a Novel Quiescent Current Control Circuit" IEEE Journal of Solid–State Circuits, IEEE Inc. New York, US. vol. 33, No. 7, Jul. 1998, pp. 1130–1133, XP000849173.

*Primary Examiner*—Steven J. Mottola
(74) *Attorney, Agent, or Firm*—Sughrue Mion, PLLC (57) ABSTRACT

An operational amplifier arrangement (OAA) includes a differential output stage (OS), input terminals of which are coupled to respective output terminals of a preceding stage (A2, A3), said operational amplifier arrangement (OAA) further includes a quiescent current control circuit (QCCC) coupled between said output stage (OS) and said preceding stage (A2, A3) and adapted to control the quiescent current of said differential output stage (OS) by commonly and simultaneously tuning respective input offset voltages (VoffA2, VoffA3) of said preceding stage (A2, A3), is characterised in that said quiescent current control circuit (QCCC) is adapted to digitally and off-line tune said input offset voltages of said preceding stage.

19 Claims, 4 Drawing Sheets

OPERATIONAL AMPLIFIER ARRANGEMENT INCLUDING A QUIESCENT CURRENT CONTROL CIRCUIT

The present invention relates to an operational amplifier arrangement including a circuit to control the quiescent output current of this operational amplifier arrangement as is further described in the preamble of claim 1.

Such an operational amplifier arrangement is already known in the art, e.g. from the article "*A 3.3 V Low-distortion ISDN Line Driver with a Novel Quiescent Current Control Circuit*", written by H. Casier, P. Wouters, B. Graindourze and D. Sallaerts, *IEEE Journal of Solid-State Circuits*, Vol. 33, Nr7, July 1998, pp 1130–1133. Therein, on p 1132, an amplifier arrangement including a quiescent current control circuit is shown and described. Basically the currents flowing in each of the two output branches of the output stage of the operational amplifier are sensed and compared in a comparator, which consists of a simple inverter and a cross-over detector. Comparison with a reference current Iref is therein performed. The output of the comparator is fed back to the input stage of the amplifier arrangement via a charge pump circuit which charges or discharges a hold capacitor, dependent on the comparator output signal: if both sensed output currents are higher than the target reference or quiescent current, the capacitor is discharged; if both sensed output currents are lower than the target quiescent current, the capacitor is charged. The charge on the capacitor is further transformed via a buffer and attenuator, into a common voltage difference between the positive input terminals of both error amplifiers constituting the stage preceding the output stage. This common voltage difference, can be considered as a common change in the individual input offset voltages of both amplifiers.

A drawback of this prior art method is that it relies on the operation of the amplifier arrangement, and on the speed of the current monitoring and comparison circuits, and the regulating circuits, i.e. resp. the cross-over detection and the charge-pump circuits. Indeed, as is explicitly cited in column 1 on P 1132, of this prior art article, the quiescent current is sampled during the quiescent state transition of the output drivers, whereby this does not pose a limit to this quiescent current control as long as the crossover detection and charge-pump circuit are fast enough to follow the input signal transitions.

However, this results in a high power consumption. A further drawback of this prior art circuit and methodology is that it is not accurate enough, especially for applications of xDSL line drivers. With xDSL is meant all digital subscriber line (DSL) applications such as ADSL, being asymmetric digital subscriber line, VDSL, being very high speed digital subscriber line, and other DSL applications.

Furthermore the update of the voltages controlling the quiescent current levels occur at the moment of zero output voltage cross-over, which induces as such distortion. For e.g. ISDN applications as mentioned in this prior art article, this is yet acceptable. However for the aforementioned xDSL applications have much more stringent distortion requirements than the ISDN applications such that the prior art method can no longer be used in these fields.

An object of the present invention is to provide an operational amplifier arrangement including a circuit for controlling the quiescent current of an output stage of this operational amplifier arrangement of the above known type but which is more power efficient and more accurate compared to the mentioned prior method and circuit, and which also results in less distortion than the prior art method.

According to the invention, this object is achieved due to the fact that said quiescent current control module is adapted to digitally control the change in the offset voltage of the preceding stage based on an off-line measurement and control which does thus no longer rely on the operation of the amplifier itself. With off-line is meant that no input signal is present to the operational amplifier, but that all bias conditions are applied. Moreover since the amplifier is not consuming dynamic power, since no ac input signal is present during the quiescent current control, a much more power efficient and undisturbed arrangement is obtained. Furthermore a digital control in general increases the precision with respect to the analog control performed by the prior art method.

A further characteristic feature of the present invention is shown in claim 2.

By individually comparing the two output currents in the two series branches of the output stage, with the predetermined target value, and to let the control of the offset voltage to be dependent on this individual comparison, a much better accuracy than the prior art system can be obtained. Indeed, in the mentioned prior art document, it is stated that both output currents have to be either higher or lower than the target, before the control of the offset voltages changes. With the present invention, control of the offset voltages can be based on the result of the individual comparison of one of both output currents with the target value.

An additional characteristic feature of the present invention is mentioned in claim 3.

This additional feature thereby allows the amplifier arrangement to not only commonly regulate the quiescent output current, but to further tune them differentially as to make them equal.

Compared to the prior art which allows only a regulation of the two quiescent currents possible in common mode, where both can only be made larger or smaller, but not be made equal, the present method is much more accurate.

Furthermore said digital control module is further adapted to control this differential tuning by means of a differently tuning of the input offset voltages of the amplifiers of the preceding stage as is stated in claim 4.

With a differential tuning of the input offset voltages is meant a simultaneous tuning of both input offset voltages of both differential amplifiers of the preceding stage, such that, at the time that one offset voltage of one of both differential amplifiers is increased with a certain amount, the other input offset of the other amplifier is decreased with this same amount.

This regulation can be further accomplished by the fact that said current sensing and comparison device is thereby not only adapted to compare both sensed output currents with a predetermined reference value as was already accomplished by the features of claim 1 or 2, but to also compare both currents with each other, as is further described by the features of claim 5. Based on the result of this comparison, the digital control module can then generate the appropriate control signals for differentially regulating the offset voltages in the correct direction. This operation thereby resulting in a regulation of both quiescent output currents differentially until they become equal.

An additional characteristic feature is that the digital control module is adapted to generate a quiescent current control sequence starting from a starting condition.

In this way a very secure calibration procedure allowing an even more accurate control of the quiescent current, is achieved.

A further characteristic feature of the present invention is that said starting condition is such that only a small or negligible current is flowing in the output stage branches as described in claim 7, and that starting from this point the output quiescent currents are commonly and gradually increased until the current sensing and comparison device detects that both output currents are both higher or equal than the predetermined reference current as is stated by claim 8.

By this methodology which is performed by the digital control module, both output currents will then reach or exceed the target predetermined reference value. In contrast to the prior art method, where the SUM of both output currents was the trigger for changing the input offset value, the present invention allows for a more accurate fine tuning based on the individual current value.

In general this first phase implies a coarse regulation which is fast. The actual currents thereby in general surmount the target reference value substantially by virtue of the physical laws governing the current-voltage characteristics of the output transistors. These large currents are however beneficial since these guarantee a warming up of the circuitry, so that all possible changes or variations in quiescent currents that result from temperature variations, will be minimized during the next phases of the calibration.

After having reached the end of the first control cycle, both currents are further fine tuned as to make them mutually equal, as is stated by claim 9. Seen in the voltage domain this results in cancelling all output offset at the output terminal of the amplifier arrangement.

This step is then followed by a further fine common regulation of the quiescent current values until they both become equal or lower than the target reference value, as is described in claim 10.

Control cycle two thus guarantees that the output currents will be equal, while they are still rather large, whereas during the third control cycle the mutually equal currents are further gradually decreased until they reach the target value. The granularity of the regulation of the input offset voltages during the third cycle is thereby much finer than the granularity of the regulation during the first cycle, resulting in a much more precise regulation.

The invention relates as well to the quiescent current control circuit included in the operational amplifier of the present invention and as well to the method for controlling the quiescent current as is performed by the above mentioned quiescent current control circuit.

It is to be noticed that the term 'coupled', used in the claims, should not be interpreted as being limitative to direct connections only.

Thus, the scope of the expression 'a device A coupled to a device B' should not be limited to devices or systems wherein an output of device A is directly connected to an input of device B. It means that there exists a path between an output of A and an input of B which may be a path including other devices or means.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

The above and other objects and features of the invention will become more apparent and the invention itself will be best understood by referring to the following description of an embodiment taken in conjunction with the accompanying drawings wherein FIG. 1 gives a schematic of an operational amplifier arrangement OAA according to the invention, FIG. 2 schematically depicts the quiescent current calibration sequence.

Figure 1:
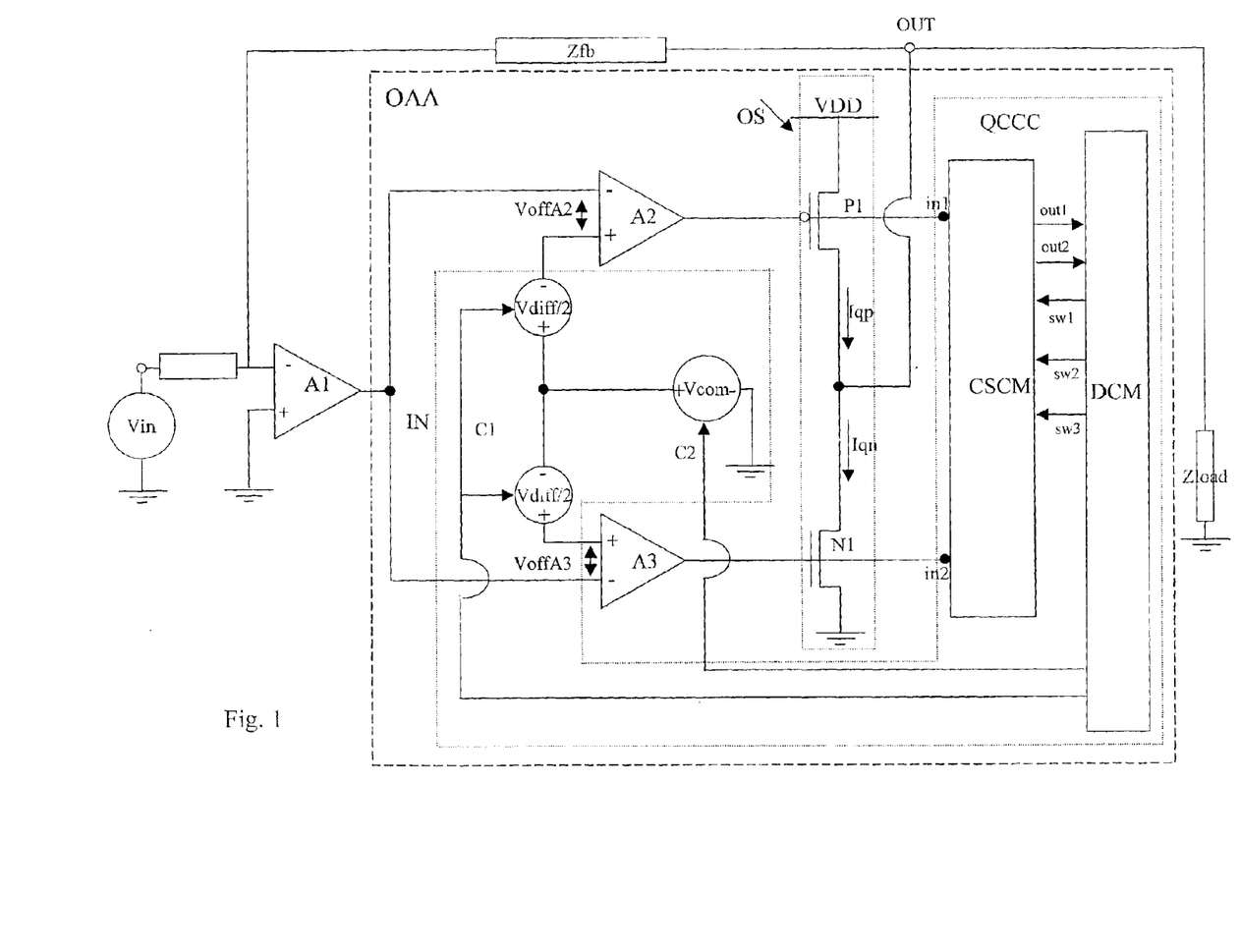

The operational amplifier arrangement OAA as depicted in FIG. 1 is for instance used in ADSL or VDSL or, in general xDSL line drivers. ADSL is the abbreviation of asymmetric digital subscriber line whereas VDSL is the abbreviation of very high speed digital subscriber line. xDSL thereby stands for all possible digital subscriber line applications.

The requirements in these xDSL applications are very stringent a solution has to be found to combine low cost, low power consumption, high bit rate, low bit error rate and severe requirements for noise and distortion performance. Therefore the quiescent current level of the output stage has to be very controlled accurately, insensitive to process and temperature variations and influence on the signal path has to be avoided.

The operational amplifier arrangement OAA of the present invention is thereby capable of providing a solution to the aforementioned requirements as will be explained below.

The operational amplifier arrangement OAA as depicted in FIG. 1 is part of a larger operational amplifier which is also schematically depicted in FIG. 1 and which includes, besides the operational amplifier arrangement OAA a common amplifier stage A1 which is receiving the input signal from an input signal source depicted as vin, for instance the D/A converted ADSL signal received from a processor. The output terminal OUT of this larger operational amplifier is then coupled to the load impedance, depicted as Zload. The larger amplifier as depicted in FIG. 1 has a single ended configuration. In applications such as xDSL, this overall amplifier configuration is duplicated such as to create a fully differential structure, whereby the input signal source vin is then coupled between two similar input terminals of two input amplifiers A1, and whereby two output terminals of this fully differential arrangement are coupled to the two terminals of the line via a hybrid and a transformer. The quiescent current regulation principle will be explained for the single ended version; for the differential operational amplifier configuration this principle is duplicated for the two differential parts. Besides the single ended and the fully differential configurations, other amplifier configurations are possible, as is well known by a person skilled in the art. These will however not be further described since these are not essential to the invention, and since a person skilled in the art is adapted to implement the invention principles within these other configurations.

The output signal of A1 serves as an input signal of the operational amplifier arrangement OAA of the present invention. The output terminal of A1 is thereby coupled to the input terminal IN of OAA. The operational amplifier arrangement includes the offset amplifiers A2 and A3, which together form the stage preceding the final output driver stage OS. For ADSL applications having stringent linearity requirements for output amplifiers, OS in general consists of a class AB amplifier.

Such a class AB amplifier, in its simplest form, basically consists of a p-type transistor P1 in series with an n-type transistor N1. In the embodiment depicted in FIG. 1 both P1 and N1 are CMOS transistors, but implementations in other technologies such as bipolar technologies are also possible. The principle of the invention will be described for this type of output amplifier, but the principle is as well possible to any type of output amplifier having two branches in series, such as class B amplifiers.

The quiescent current is defined as the current which is flowing in the output stage OS when no input signal is applied. Such a current is defined by the DC bias conditions. Since variations on this current directly add to the power consumption and influence the performance with respect to cross-over distortion, the value of the quiescent current is to be set as accurate as possible. Moreover, variations due to temperature have to be avoided. To this purpose a new Quiescent Current Control Circuit, abbreviated with QCCC, was developed which will be described now.

The Quiescent Current Control Circuit depicted in FIG. 1 mainly consists of 3 separate blocks: a first block denoted CSCM which represents a current sensing and comparison means, a second block denoted DCM representing a Digital Control Module and a third block schematically represented by 3 tunable voltage sources, of which one is denoted Vcom and two others are denoted Vdiff/2, which represent circuitry for adjusting the input offset voltages of the two differential amplifiers A2 and A3 of the preceding stage. In one embodiment of the present invention, these controllable voltage sources consists of D/A convertors. However other implementations are also possible and will therefore not be further described since these are well known to a person skilled in the art.

The current sensing and comparison means CSCM is mainly adapted to sense the currents flowing in the two separate series branches of the output stage, being the currents through P1 and N1, and respectively denoted Iqp and Iqn. CSCM is further adapted to compare both currents with a predetermined reference Iqref, being the target value for the quiescent current, and to compare them with each other as to verify whether these output currents are equal or not.

The results of the first comparison operation, i.e., the comparison of the individual currents Iqp and Iqn, with the predetermined target reference Iqref, as well as the result of the first comparison operation, i.e. the mutual comparison of Iqp and Iqn, will be communicated to the DCM via signals denoted Out 1 and Oout2.

Figure 3:
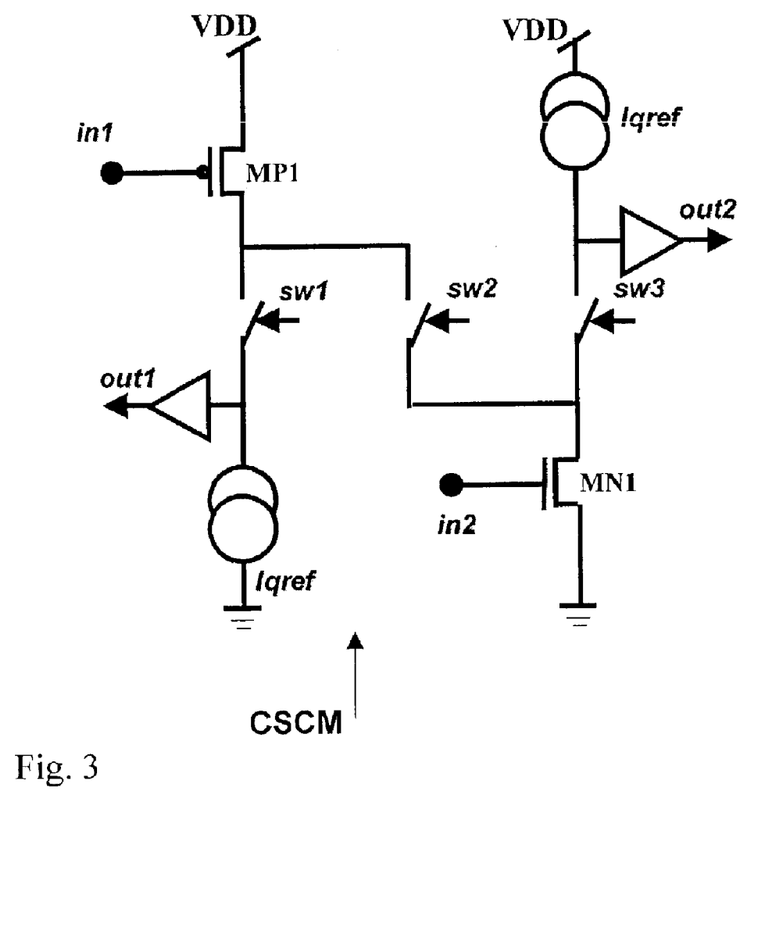
FIG. 3 shows a transistor level implementation of the current sense and comparison means CSCM as shown in FIG. 1.

Embodiments of such a current sensing and comparison means are for instance shown in FIG. 3. This block mainly consists of 2 current comparators, one coupled to the gate of P1, and another coupled to the gate of N1. Which comparator is active is determined by means of the control of the 3 switches sw1, sw2 and sw3; the respective control signal for these switches being as well denoted by means of sw1, sw2 and sw3. The control signals are generated by the digital control module DCM.

The first comparator within CSCM consists of a pMOS transistor MP1, which is a mirror transistor for P1, meaning that the current through MP1 is proportional to the current through P1, and a first reference current source Iqref. This reference current source is proportional, with the same proportionality factor as the currents through P1 and MP1, to the target quiescent current The second comparator of CSCM consists of nMOS transistor MN1, being a mirror transistor for N1, meaning that the current through MN1 is proportional to the current through N1. Again the same proportionality factor is used, and the latter is also used for the second current source Iqref with respect to the target quiescent current through N1. For the class AB output stage OS the target quiescent currents through N1 and P1, and consequently both current sources Iqref, are equal.

If sw1 is such that the same named switch is closed, and sw2 is such that the same named switch is open, the current through MP1 is compared with Iqref. If the current is higher, the output of the amplifier coupled to the intersection point between current source Iqref and MP1, will be put high. If the current through MP1 is lower than Iqref, out1 will be low. If at the same time sw3 is such that switch sw3 is closed, also the current through MN1 is compared with Iqref, the result being indicated by the value of out2.

If all switches sw1, sw2 and sw3 are closed, the current through MP1 is compared with the current through MN1. Indeed, if both currents are equal, the current through MP1 entirely flows through MN1, and the output of both amplifiers will be the same. If both currents MP1 and MN1 are not equal, the output of both amplifiers will be different.

The switch sw2 thus determines the mode of comparison, and the value of the output signals out1 and out2, in combination with the value of sw2 thus determines either the absolute individual comparison of the current values with the reference, or their relative difference.

Output signals out1 and out2 are delivered to the digital control module DCM, which acts as a sequencing unit, or a finite state machine, starting from an initial state and sequencing through a series of successive control cycles for the quiescent current control. While sequencing through the different cycles, dedicated control signals are delivered and received to and from the CSCM and to the different tunable voltage sources as will now be explained.

Remark that, in order to obtain the required accuracy and not to influence the signal path, the quiescent current control circuit is preferentially operating when no signals are applied to the inputs of both amplifiers A2 and A3, thus when the pre-amplifier is not receiving any input signal.

First, at start-up, the DCM is generating a stable starting condition setting the output currents to a predetermined low value. This is realised by generating the control signals C1 to the voltage sources denoted Vdiff/2 to the appropriate value such that the input offset values denoted VoffA2 and VoffA3 are sufficiently high. This ensures the output currents Iqp and Iqn to be sufficiently low, in general to lie below a predetermined current limit value, for instance 10 $\mu$A.

For the embodiment with the amplifiers and voltage sources with the voltage polarities as depicted in FIG. 1, and for A2 and A3 being inverting amplifiers, Vdiff/2 is set sufficiently high, e.g. to the supply voltage VDD. By the inverting operations of both A2 and A3, the output of A2 is set to the supply voltage, turning off P1. Similarly the output of A3 is pulled to the lowest possible voltage, turning off N1.

After setting this starting condition, DCM enters in its first control cycle during which the quiescent currents are simultaneously increased until they reach or both exceed their predetermined target value Iqref. This is performed by DCM seting the value of C1 such as to decrease the value of Vdiff/2, thereby gradually releasing the input offset values of A2 and A3. At the same time DCM sends control signals sw1 to sw3 to CSCM, such to inform and position the latter to compare the mirror currents, which are directly proportional with the two individually quiescent output currents Iqp and Iqn, with the predetermined target current Iqref. As long as the currents are below this target, CSCM communicates this to DCM by means of control signals out1 and out2, upon which DCM adapts the value of C1 and thereby further steers the voltage sources such as to decrease Vdiff/2. In the embodiment whereby the voltage sources are realised by an D/A converter, DCM merely adapts the code for setting the voltage at the output of the D/A converter. Upon detecting and communicating by CSCM that Iqp and Iqn both have reached the target value Iqref, this phase is finished.

It is to be remarked that the down-regulation of the voltages Vdiff/2 is performed in rather large steps, such as to quickly obtain the end of this phase. Therefore the regulation is a coarse regulation, whereby, due to the intrinsic physical laws governing the operation of the output transistors, the output currents quickly increase and thus in general largely overshoot the predetermined target Iqref. For a MOS transistor, the current-voltage relationship is a quadratic one, for a bipolar transistor even an exponential one.

The overshoot of the target reference current that is thereby obtained results in a warming up of the circuits. However this allows for compensation of junctions temperature variations as will be further explained.

Figure 4:
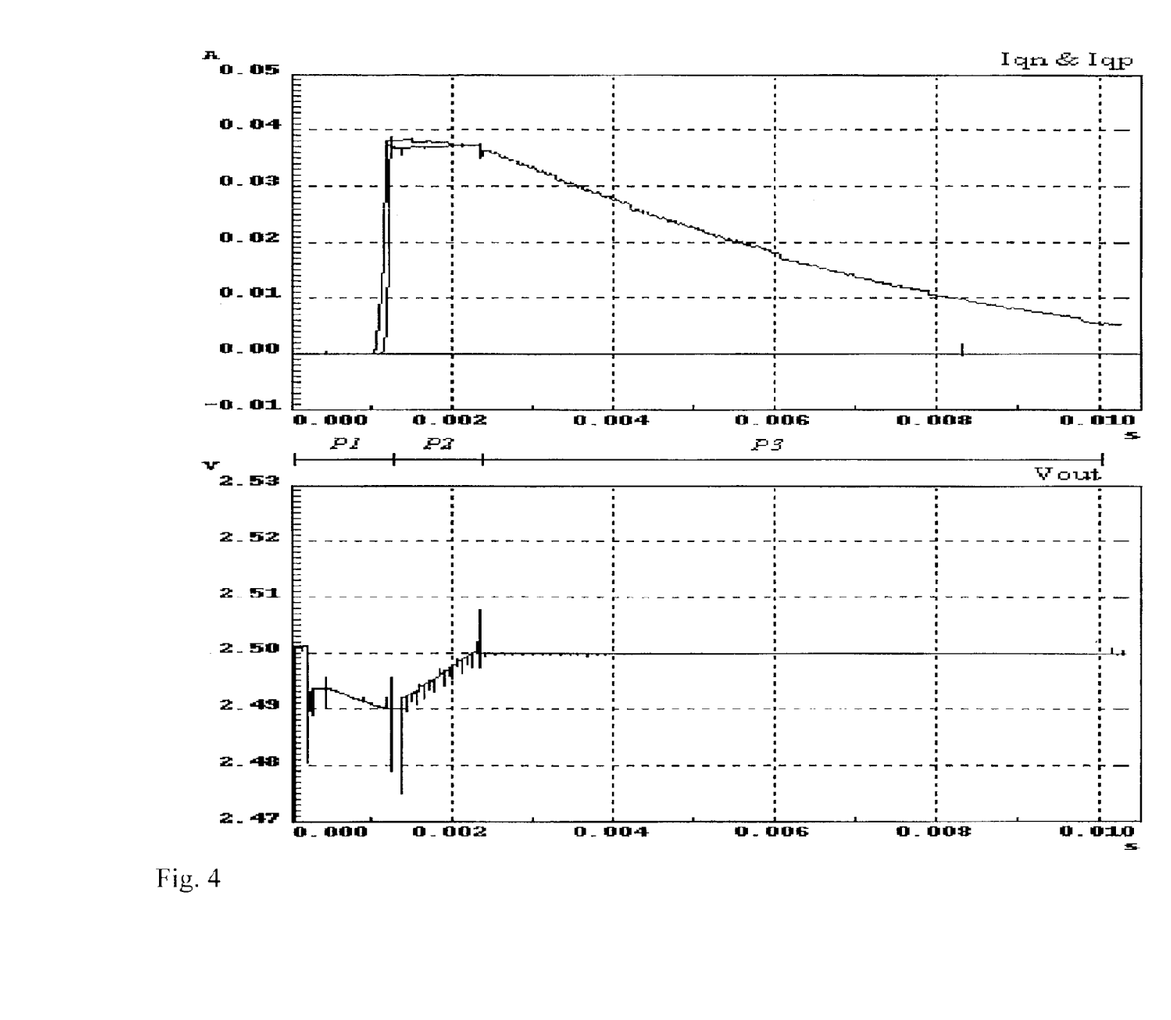
FIG. 4 shows measurement results of the quiescent currents and the output voltage of the amplifier arrangement of FIG. 3.

In FIG. 4 both quiescent currents Iqn and Iqp, and the output voltage vout, are shown as a function of the time, for a particular output amplifier. The quiescent currents are expressed in Amperes, and the output voltage in Volt. This first control cycle is denoted P1 and takes place in a about one milliseconds, from 0 to 1.2 ms. It can be observed that at the end of the first control cycle the quiescent currents reach about 35 mA, and the output voltage has a level of 2.49 Volt. Remark that the target level for the quiescent current is only 5 mA.

This first control cycle is followed by a second control cycle during which the quiescent currents are both compared with each other and are further tuned such as to make them equal. This is done by DCM adapting the value of control signal C2 such as to change now the value of Vcom, whereas the values of Vdiff/2 are kept constant. Following the signs of the voltages in FIG. 1, an increase of Vcom will result in an increase of the input offset VoffA3 in A3, and a simultaneous decrease with the same amount of the input offset VoffA2 of A2. Differentially tuning this offset results in differentially tuning the quiescent currents Iqp and Iqn. CSCM is now performing a mutual comparison between these currents, as was ordered by DCM by means of control signal sw2. As long as both currents are different, DCM further adapts the control signal C2 to the voltage source Vcom such as to further tune them to become equal, based on the measurement and comparison results communicated to it by CSCM. Upon detecting by CSCM that both currents are equal, this is communicated again to DCM, and phase or control cycle 2 ends. It is to be remarked that the comparison is of course always performed within certain measurement tolerances, and that therefore the term "equal" has to be interpreted keeping in mind these measurement tolerances.

In FIG. 4 this second cycle, indicated by P2, is taking place between 1.2 and 2.4 msec. During this phase the output voltage increases to the value of 2.5 V, which, for the embodiment of FIG. 1 with a power supply VDD of 5 V, corresponds to exactly the medium value between the ground and the power supply. This further indicates that all output offset is removed.

The junction temperature of the die is still high since the currents have not decreased substantially during this second phase. This means that the calibration is done for operating conditions, and not for so-called cold conditions. Indeed, the generated offset voltages will be the correct one for the normal operating conditions, where the junction temperature of the chip corresponds to the normal operating temperature.

From then on, phase or control cycle 3 starts. During this phase DCM is keeping the value of Vcom obtained during the previous cycle and will further control the value of Vdiff/2 by means of further tuning control signal C1 such as to now again commonly increase the offset values of both amplifiers A2 and A3, thereby resulting in a common lowering of the quiescent currents Iqn and Iqp for A2 and A3 being inverting amplifiers. DCM thereby again sends to CSCM an input control signal sw2, for opening switch sw2, such as to again compare the measured currents with the predetermined target value Iqref. As long as both values are higher than this Iqref value, C1 is further increasing the value of Vdiff/2. Upon detecting by CSCM that both Iqn and Iqp are now smaller or equal than this Iqref, the third cycle ends and the quiescent current calibration is finished.

The tuning during this phase takes place with much smaller steps, such as to allow for a gradual decrease of the quiescent output current. Therefore this phase takes much longer, as indicated in FIG. 4 by P3, which starts at 2.4 msec and ends at 10 msec. For this embodiment the target quiescent current was set at 5 mA, which is clearly reached at that time. Remark that during this whole third cycle the output voltage Vout at the output terminal OUT is kept constant, indicating no output offset voltage. This last cycle is then also called the fine tune cycle.

Figure 2:
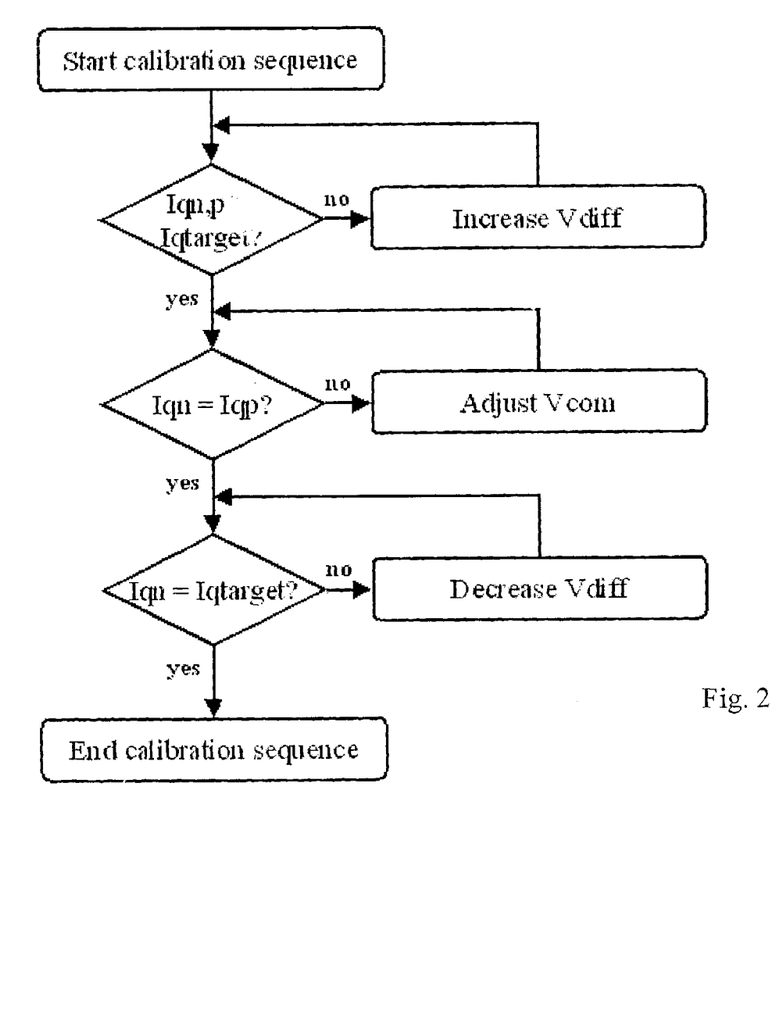

A summary of the different steps of the control is shown in the flowchart depicted in FIG. 2.

Once the calibration cycle has ended, the input of the amplifier is released for normal operation.

It is to be remarked that also other calibration cycles are possible, whereby for instance both currents are gradually and commonly increased starting from a very low to zero starting value, until they reach their predetermined target, after which phase these are then mutually compared and made equal.

While the principles of the invention have been described above in connection with specific apparatus, it is to be clearly understood that this description is made only by way of example and not as a limitation on the scope of the invention, as defined in the appended claims.

I claim:

1. An operational amplifier arrangement comprising:
    a differential output stage having input terminals coupled to respective output terminals of a preceding stage, said operational amplifier arrangement further including;
    a quiescent current control circuit coupled to respective output terminals of said output stage and said preceding stage, said quiescent current control circuit controlling the quiescent current of said differential output stage by commonly and simultaneously tuning respective input offset voltages of said preceding stage,
    wherein said quiescent current control circuit digitally and off-line tunes said respective input offset voltages of said preceding stage, said quiescent current control circuit including:
    a digital control module adapted to control the common tuning of said input offset voltages, based on at least one signal received from a current sense and comparison module included in said quiescent current control circuit and coupled between said output stage and said digital control module,
    whereby said current sense and comparison module is adapted to measure the output currents in two series branches of said output stage, to compare them individually with a predetermined reference current, and to generate said at least one signal to said digital control module indicative of the result of said comparison.

2. The operational amplifier arrangement according to claim 1, wherein said quiescent current control circuit is further adapted to differentially control said output currents in said two series branches of said output stage.

3. The operational amplifier arrangement according to claim 2, wherein said digital control module is further adapted to control the differential tuning of said input offset voltages of said preceding stage.

4. The operational amplifier arrangement according to claim 2, wherein said quiescent current control circuit is further adapted to compare said output currents in said two series branches of said output stage with each other and is adapted to provide an output signal to said digital control module indicative of whether said output currents are equal.

5. The operational amplifier arrangement according to claim 1, wherein said digital control module is adapted to generate a quiescent current control sequence starting from a starting condition.

6. The operational amplifier arrangement according to claim 5, wherein said digital control module is adapted to set said starting condition by controlling said input offset voltages to be sufficiently high such that the output currents in said two series branches of said output stage are lower than a predetermined lower limit value.

7. The operational amplifier arrangement according to claim 6, wherein said digital control module is further adapted to generate a first control cycle upon reaching said starting condition, whereby during said first control cycle said digital control module is further adapted to commonly control the decrease of said input offset voltages of said preceding stage, and to send a control signal to said current sensing and control module, whereby said current sense and control module is further adapted to, upon receipt of said control signal, compare said output currents in said series output branches with said predetermined value, said digital control module further being adapted to end said first control cycle upon receiving at least one output signal of said current sense and comparison module indicative of the fact that both output currents are higher than said predetermined reference current.

8. The operational amplifier arrangement according to claim 7, wherein said digital, control module is further adapted to generate a second control cycle upon reaching the end of said first control cycle, whereby during said second control cycle said digital control module is further adapted to control the differential tuning of said input offset voltages of said preceding stage and to send a control signal to said current sense and comparison module, whereby said current sense and control module is further adapted to, upon receipt of said control signal, mutually compare said output currents in said series output branches, said digital control module further being adapted to end said second control cycle ending upon receiving at least one output signal of said current sense and comparison module indicative of the fact that said output currents are equal.

9. The operational amplifier arrangement according to claim 8, wherein said digital control module is further adapted to generate a third control cycle upon reaching the end of said second control cycle, whereby during said third control cycle said digital control module is further adapted to commonly control the increase of said input offset voltages of said preceding stage and to send a control signal to said current sensing and control module whereby said current sense and control module is further adapted to, upon receipt of said control signal, compare said output currents in said series output branches with said predetermined value, said digital control module further being adapted to end said third control cycle upon receiving at least one output signal of said current sense and comparison module indicative of the fact that both output currents are lower than said predetermined reference current.

10. An operational amplifier arrangement comprising:
   an amplifier stage comprising a first and second operational amplifiers;
   a differential output stage having input terminals coupled to respective output terminals of said amplifier stage;
   a quiescent current control circuit coupled to said amplifier stage and to respective output terminals of said output stage, said quiescent current control circuit controlling the quiescent current of said differential output stage by individually tuning input offset voltages of said first and second operational amplifiers,
   wherein said quiescent current control circuit digitally and off-line tunes said input offset voltages of said first and second operational amplifiers.

11. The operational amplifier arrangement according to claim 1, wherein said quiescent current control circuit includes:
   a digital control module adapted to control the common tuning of said input offset voltages; and
   a current sense and comparison module, for transmitting said at least one signal to said digital control module, said current sense and comparison module included in said quiescent current control circuit and coupled between said output stage and said digital control module,
   whereby said current sense and comparison module is adapted to measure the output currents in two series branches of said output stage, to compare them individually with a predetermined reference current, and to generate said at least one signal to said digital control module indicative of the result of said comparison.

12. The operational amplifier arrangement according to claim 11, wherein said quiescent current control circuit is further adapted to differentially control said output currents in said two series branches of said output stage.

13. The operational amplifier arrangement according to claim 12, wherein said digital control module is further adapted to control the differential tuning of said input offset voltages of said preceding stage.

14. The operational amplifier arrangement according to claim 12, wherein said quiescent current control circuit is further adapted to compare said output currents in said two series branches of said output stage with each other and is adapted to provide an output signal to said digital control module indicative of whether said output currents are equal.

15. The operational amplifier arrangement according to claim 10, wherein said digital control module is adapted to generate a quiescent current control sequence starting from a starting condition.

16. The operational amplifier arrangement according to claim 15, wherein said digital control module is adapted to set said starting condition by controlling said input offset voltages to be sufficiently high such that the output currents in said two series branches of said output stage are lower than a predetermined lower limit value.

17. The operational amplifier arrangement according to claim 16, wherein said digital control module is further adapted to generate a first control cycle upon reaching said starting condition, whereby during said first control cycle said digital control module is further adapted to commonly control the decrease of said input offset voltages of said preceding stage, and to send a control signal to said current sensing and control module, whereby said current sense and control module is further adapted to, upon receipt of said control signal, compare said output currents in said series output branches with said predetermined value, said digital control module further being adapted to end said first control cycle upon receiving at least one output signal of said current sense and comparison module indicative of the fact that both output currents are higher than said predetermined reference current.

18. The operational amplifier arrangement according to claim 17, wherein said digital control module is further adapted to generate a second control cycle upon reaching the end of said first control cycle, whereby during said second control cycle said digital control module is further adapted to control the differential tuning of said input offset voltages of said preceding stage and to send a control signal to said current sense and comparison module, whereby said current sense and control module is further adapted to, upon receipt of said control signal, mutually compare said output currents in said series output branches, said digital control module further being adapted to end said second control cycle ending upon receiving at least one output signal of said current sense and comparison module indicative of the fact that said output currents are equal.

19. The operational amplifier arrangement according to claim 18, wherein said digital control module is further adapted to generate a third control cycle upon reaching the end of said second control cycle, whereby during said third control cycle said digital control module is further adapted to commonly control the increase of said input offset voltages of said preceding stage and to send a control signal to said current sensing and control module, whereby said current sense and control module is further adapted to, upon receipt of said control signal, compare said output currents in said series output branches with said predetermined value, said digital control module further being adapted to end said third control cycle upon receiving at least one output signal of said current sense and comparison module indicative of the fact that both output currents are lower than said predetermined reference current.

* * * * *